(12) United States Patent
Fournier et al.

(10) Patent No.: US 7,085,964 B2
(45) Date of Patent: Aug. 1, 2006

(54) DYNAMIC TEST PROGRAM GENERATOR FOR VLIW SIMULATION

(75) Inventors: Laurent Fournier, Givat Elah (IL); Shai Rubin, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 824 days.

(21) Appl. No.: 09/789,430

(22) Filed: Feb. 20, 2001

(65) Prior Publication Data

US 2002/0116694 A1    Aug. 22, 2002

(51) Int. Cl.
*G06F 11/26* (2006.01)
(52) U.S. Cl. .............................. 714/33; 714/10; 714/35; 714/728; 714/741; 703/14; 703/15; 716/4; 716/5
(58) Field of Classification Search .................. 714/10, 714/33, 728, 35, 741; 703/14, 15; 716/4, 716/5
See application file for complete search history.

(56) References Cited

U.S. PATENT DOCUMENTS 6,484,135 B1 * 11/2002 Chin et al. ..................... 703/23
6,606,721 B1 * 8/2003 Gowin, Jr. et al. ......... 714/728
6,704,859 B1 * 3/2004 Jacobs et al. ............... 712/237

* cited by examiner

*Primary Examiner*—Robert Beausoliel
*Assistant Examiner*—Joseph D Manoskey
(74) *Attorney, Agent, or Firm*—Darby & Darby

(57) ABSTRACT

A method for functional verification of a design for a parallel processing device includes receiving a sequence of single instructions from a dynamic test program generator, and assembling a plurality of the instructions from the sequence into an instruction word, in accordance with predetermined rules applicable to the parallel processing device. The instruction word is input to a simulator of the parallel processing device so as to determine a response of the device to the instruction word.

23 Claims, 2 Drawing Sheets

DYNAMIC TEST PROGRAM GENERATOR FOR VLIW SIMULATION

FIELD OF THE INVENTION

The present invention relates generally to simulation testing of processor designs, and specifically to dynamic test program generation.

BACKGROUND OF THE INVENTION

Very Long Instruction Word (VLIW) computer architectures were originally proposed in the 1970s. Early descriptions of VLIW processors include "The VLIW Machine: A Multiprocessor for Compiling Scientific Code," by Fisher, in *IEEE Computer* (July, 1984), pages 45–53, and "The Cydra 5 Departmental Supercomputer: Design Philosophies, Decisions and Trade-offs," by Rau et al., in *IEEE Computer* (January, 1989), pages 12–35, which are incorporated herein by reference. Recently, a number of major manufacturers, including Intel and Hewlett-Packard, have announced their intention to develop VLIW microprocessors. A brief survey of VLIW principles and developments is presented by Pountain in an article entitled "The Word on VLIW," published in *Byte Magazine* (April 1996). This article is available at www.byte.com/art/9604/sec8/art3.htm and is incorporated herein by reference.

FIG. 1 is a block diagram that schematically illustrates a multi-instruction Very Long Instruction Word 20, as is known in the VLIW art. (The terms "word" and "VLIW" are used interchangeably hereinafter.) VLIW architectures group together several single instructions 22 in word 20, and execute them in parallel. Additional bits (not shown in the figure) may be added to the word for other purposes, such as specifying the VLIW format or predicating the execution of single instructions. For a given VLIW architecture, there are strong rules dictating the number, types and ordering of single instructions that may be combined in a word. In the hypothetical example shown in FIG. 1, the rules dictate that the first instruction 22 be a memory instruction, the second a floating point unit instruction, and the third and fourth arithmetic instructions. The format of word 20 is shown here by way of example, and many other VLIW formats are also possible, including different types and numbers of instructions in different orders, and incorporation of additional control bits, as noted above. In addition, the VLIW rules place restrictions on the resources that can be used by instructions in a single word, for example, that no two instructions may use the same target register.

A custom VLIW compiler is responsible for converting source code into multi-instruction words that obey the applicable rules. The off-line compiler relieves both the programmer and the processor of the burden of finding the correct order for executing the instructions. The VLIW processor receives the legally-compiled instruction words and executes the instructions in each word in parallel. It thus can achieve higher processing speed than is possible for comparable single-instruction devices, without the need for special hardware to order the instructions for execution at run time, as is required in parallel, super scalar processors.

Because VLIW architectures have not yet gained wide acceptance, there has been only limited work done on testing and simulation tools for use in VLIW processor design. One of the few published accounts of work in this field is an article by Moreno et al., entitled "Simulation/Evaluation Environment for a VLIW Processor Architecture," in *IBM Journal of Research and Development* 41:3 (1997). This article is available at www.research.ibm.com/journal/rd/413/moreno.html, and is incorporated herein by reference. The authors describe an environment comprising an optimizing compiler, which generates instructions in a VLIW assembly language; a translator from VLIW assembly code into IBM PowerPC® assembly code, which emulates the functionality of the VLIW processor for the specific VLIW program; and a cycle timer, invoked by the emulating code, which processes VLIW execution traces as they are generated.

The environment described by Moreno et al. relies on static compilation and translation of instructions prior to simulation, rather than any sort of dynamic instruction generation during simulation. Static test generation is the most common method for functional verification of all sorts of circuit designs. The test engineer (or test generation program) prepares a sequence of instructions, which are expected to give certain results when run by the circuit under test. After the test generation is completed, the test instructions are passed to an architectural simulator program, also known as a behavioral simulator, which models the execution of the instructions by the target hardware. The results of the simulation are compared to the expected results. Any differences are indicative of potential bugs.

Dynamic test program generators are also known in the art of functional verification. They are used mainly for testing designs of single-instruction processors. Although typically more complex to implement than static approaches, dynamic testing enables test instructions to be generated while taking into account the current state of the processor, so that the simulator can run "smarter" tests. For example, U.S. Pat. No. 5,202,889, to Aharon et al., whose disclosure is incorporated herein by reference, describes a dynamic process for the generation of biased, pseudo-random test instruction patterns for the functional verification of hardware designs. The dynamic test generation approach combines instruction generation and simulation in a single process. The test program generator chooses each instruction in sequence, selects the resources the instruction is to use, and initializes the simulated resources as necessary to define the beginning state of the test pattern. Each instruction that is generated is passed immediately to the simulator for execution. The simulator executes the instruction and updates its resources to reflect the appropriate simulation state, according to the semantics of the instructions received from the test program generator. It then returns the results to the test program generator, for use in determining the next instruction to generate. This results enable the test program generator, for example, to create a resource dependency between successive instructions.

Thus, dynamic test program generation provides an efficient, generic means for testing different features of device designs. Although the dynamic approach has been used mainly for functional verification of large-scale microprocessors, such as the PowerPC and Intel x86 families, it can also be adapted to target devices of other kinds. For example, Rubin et al. describe a new dynamic testing methodology for digital signal processors in an article entitled "Fast Construction of Test-Program Generators for Digital Signal Processors," published in the proceedings of the *IEEE International Conference on Acoustics, Speech and Signal Processing—ICASSP'99*, vol. 4 (1999), pages 1989–1992, which is incorporated herein by reference. As another example, U.S. Pat. No. 5,592,674, to Gluska et al., whose disclosure is incorporated herein by reference, describes a method for automatic verification of external interrupts based on a dynamic testing approach, which is applicable to pipelined and super scalar microprocessors. Other methods for verification and simulation based on dynamic test program generation are described in U.S. Pat. No. 5,572,666, to Whitman; U.S. Pat. No. 5,729,554, to Weir et al.; U.S. Pat. No. 5,732,247, to Dearth et al.; and U.S. Pat. No. 5,956,478, to Huggins. The disclosures of all of these patents are incorporated herein by reference.

The dynamic testing approach is, in principle, also applicable to VLIW architectures. Dynamic test program generators developed for single-instruction architectures, however, are not suitable for generating VLIW instructions. For one thing, single-instruction devices do not have anything like the strict, general rules imposed on instruction grouping and ordering for VLIW devices. (At most, in a single-instruction device, certain specific instructions must be preceded or succeeded by certain other instructions.) Therefore, single-instruction test generators, as are known in the art, do not have the facilities to deal with rules like these. In addition, VLIW devices have rules governing the legality and semantics of resource selection for a given single instruction that differ fundamentally from those used in single-instruction devices. For example, as noted above, the same target registers typically cannot be used twice in a VLIW. Moreover, the source registers for all of the instructions in the word use the data that existed before the execution of any of the instructions, even when the instructions were generated before the particular data.

Thus, existing dynamic test program generators are not by themselves suitable for use in testing VLIW architectures. It would therefore appear to be necessary to develop new, dedicated dynamic test program generators to serve the special needs of testing VLIW architectures.

SUMMARY OF THE INVENTION

Preferred embodiments of the present invention enable dynamic test program generation for VLIW design verification, without the large investment of time and resources that would be required to develop a new, dedicated infrastructure for this purpose.

In preferred embodiments of the present invention, a single-instruction-to-VLIW converter is provided as an interface between a single-instruction dynamic test program generator and a VLIW architecture simulator. The test program generator, typically an existing, general-purpose tool, generates single instructions as though it was testing a single-instruction device. The converter gathers the instructions into words (VLIWs) that obey the predetermined rules of the VLIW architecture. When the converter has built a complete, legal word, it passes the word to the simulator for execution. After executing the instructions in the word, the simulator returns its execution results to the converter. The converter processes the results in order to provide feedback to the test program generator, which uses the feedback in generating further single instructions.

Thus, the single-instruction-to-VLIW converter enables the existing dynamic test program generator to operate in its normal, single-instruction mode, substantially without modification, even while testing a VLIW design. If the generator is of a type that allows an operator to control the instruction sequence that it generates and the resources that it uses, then the generator is preferably programmed to generate instruction sequences that can be easily combined into legal words by the converter. This type of operator control is not a necessity, however, and the converter can also work with existing test program generators that do not offer this facility. If necessary, the converter reorders the instructions provided by the generator and pads them with no-operation codes (NOPs) to make legal VLIWs.

Preferably, for each single instruction from the test program generator that does not complete a VLIW, the converter returns feedback to the generator corresponding to NOP behavior, as though the simulator had received and executed a NOP and therefore had not changed its state. (This type of feedback is referred to in the present patent application and the claims as "NOP feedback" or "null feedback.") The NOP feedback continues until the converter has finished constructing a complete VLIW, passed it to the simulator, and received real feedback in return. There is thus a lag in the real feedback supplied to the generator, making its operation slightly less "dynamic" than its normal interaction with a single-instruction simulator would be. Still, the operation of the converter offers considerably more interplay between the test program generator and the VLIW simulator than could any static alternative, such as applying a VLIW compiler to a complete set of test instructions after generation. Only a custom-built, dedicated VLIW test program generator would achieve complete dynamic interaction with the simulator, but at considerably higher cost and much longer development time than the solution of the present invention.

There is therefore provided, in accordance with a preferred embodiment of the present invention, a method for functional verification of a design for a parallel processing device, including:

receiving a sequence of single instructions from a dynamic test program generator;

assembling a plurality of the instructions from the sequence into an instruction word, in accordance with predetermined rules applicable to the parallel processing device; and inputting the instruction word to a simulator of the parallel processing device so as to determine a response of the device to the instruction word.

Preferably, receiving the sequence of single instructions includes providing feedback to the generator after each of the instructions, so that the generator generates a subsequent instruction in the sequence responsive to the feedback, wherein providing the feedback includes receiving the response to the instruction word from the simulator, and producing the feedback to the generator based on the response. Further preferably, when one of the instructions is received and the instruction word is not input to the simulator before receiving the subsequent instruction in the sequence, providing the feedback includes providing null feedback to the generator, wherein providing the null feedback most preferably includes providing the feedback as though the device had executed a no-operation (NOP) instruction.

Preferably, assembling the plurality of the instructions includes holding the instructions in a buffer until sufficient instructions of appropriate instruction types are received to enable the instruction word to be assembled in accordance with the rules. Additionally or alternatively, assembling the plurality of the instructions includes assembling no-operation (NOP) instructions together with the instructions received from the generator when after receiving a predetermined number of the instructions, sufficient instructions of appropriate instruction types have not been received so as to enable the instruction word to be assembled in accordance with the rules.

In a preferred embodiment, the parallel processing device includes a Very Long Instruction Word (VLIW) device, and assembling the plurality of the instructions includes assembling a very long instruction word containing the instructions.

Preferably, assembling the plurality of the instructions includes assembling the instructions in an order dictated by the rules. Additionally or alternatively, assembling the plurality of the instructions includes assembling the instructions into the word only if the instructions use resources of the device in accordance with the rules, wherein assembling the instructions into the word includes ensuring that the instructions in the word use source and target addresses in the device in accordance with the rules.

There is also provided, in accordance with a preferred embodiment of the present invention, apparatus for functional verification of a design for a parallel processing device, the apparatus including a computing platform that includes one or more computer processors, and which is arranged to generate a sequence of single instructions using a dynamic test program generator program, to assemble a plurality of the instructions from the sequence into an instruction word in accordance with predetermined rules applicable to the parallel processing device, and to simulate operation of the parallel processing device using a simulator program so as to determine a response of the device to the instruction word.

There is additionally provided, in accordance with a preferred embodiment of the present invention, a computer software product for functional verification of a design for a parallel processing device, the product including a computer-readable medium in which program instructions are stored, which instructions, when read by a computer, cause to computer to receive a sequence of single instructions from a dynamic test program generator, to assemble a plurality of the instructions from the sequence into an instruction word, in accordance with predetermined rules applicable to the parallel processing device, and to input the instruction word to a simulator of the parallel processing device so as to determine a response of the device to the instruction word.

The present invention will be more fully understood from the following detailed description of the preferred embodiments thereof, taken together with the drawings in which:

DETAILED DESCRIPTION OF PREFERRED EMBODIMENTS

Figure 1:
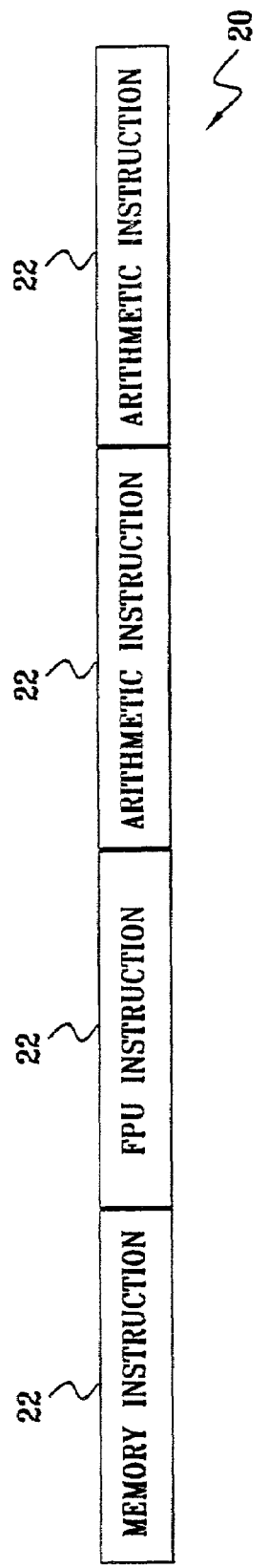
FIG. 1 is a block diagram that schematically illustrates the structure of a Very Long Instruction Word (VLIW), as is known in the art.
Figure 2:
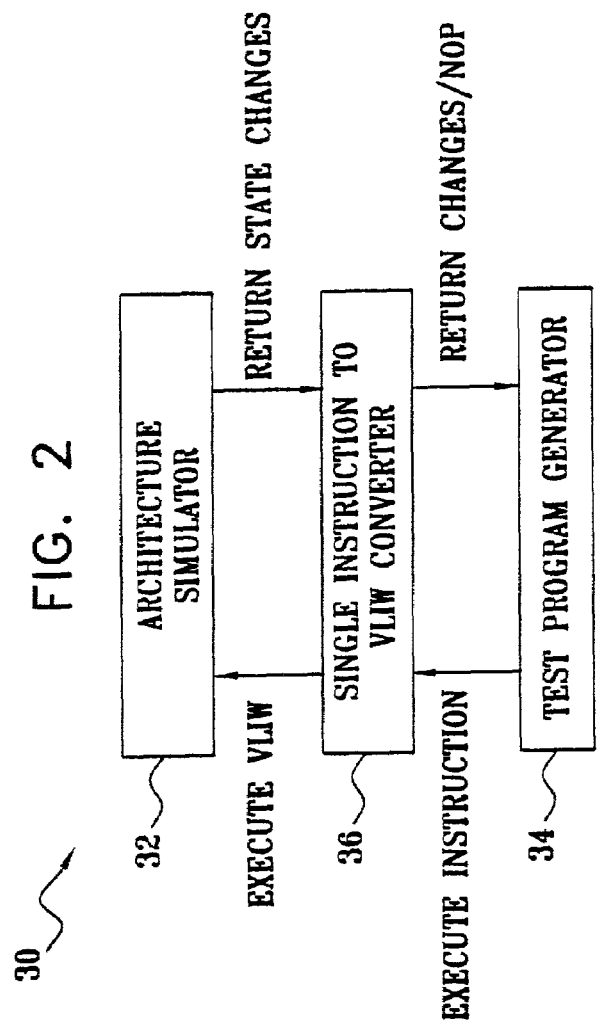
FIG. 2 is a block diagram that schematically illustrates a system for design verification, in accordance with a preferred embodiment of the present invention.

FIG. 2 is a block diagram that schematically illustrates a system 30 for verification of the design of a target VLIW device, in accordance with a preferred embodiment of the present invention. System 30 comprises a VLIW architecture simulator 32, which is designed to receive full, multi-instruction VLIWs, such as word 20 shown in FIG. 1, and to simulate execution of the VLIWs by the target device. A dynamic test program generator 34, as is known in the art, generates single instructions. A single-instruction-to-VLIW converter 36 receives the instructions from generator 34, assembles them into legal words, and inputs the words to simulator 32 for execution. After the simulator executes each input word, it returns its execution results, typically changes in the state of the simulated device, to the converter. The converter conveys feedback to the generator regarding the state changes (or NOP feedback when no change has occurred, as described below). The generator then uses the feedback dynamically in generating further instructions.

Converter 36 is a novel component, which makes possible the operation of system 30. Simulator 32 and generator 34, however, may be of any suitable type known in the art that is capable of performing step-by-step execution of instructions and reporting on the changes in its state after each instruction. The simulator is preferably also able to report and change the context of various resources on request. For example, simulator 32 may be constructed using the translator and cycle timer described in the above-mentioned article by Moreno et al., but without the static compiler used in that system. A suitable test program generator for use as generator 34 is described in the above-mentioned article by Rubin et al. Further aspects of this test program generator are described in the above-mentioned U.S. Pat. No. 5,202,889, as well as in an article by Aharon et al., entitled "Test Program Generation for Functional Verification of PowerPC Processors in IBM," published in *Proceedings of the ACM/IEEE 32nd Design Automation Conference* (1995), which is incorporated herein by reference. Alternatively, generator 34 may comprise other dynamic test program generators, as are known in the art.

Typically, the functions of simulator 32, generator 34 and converter 36 are carried out by software modules, which run on a suitable computing platform. The platform may comprise either a stand-alone computer workstation or a group of networked processors. The software modules may be provided to the computing platform in electronic form, over a network, for example, or they may alternatively be supplied on tangible media, such as CD-ROM or DVD, for installation on the platform.

Figure 3:
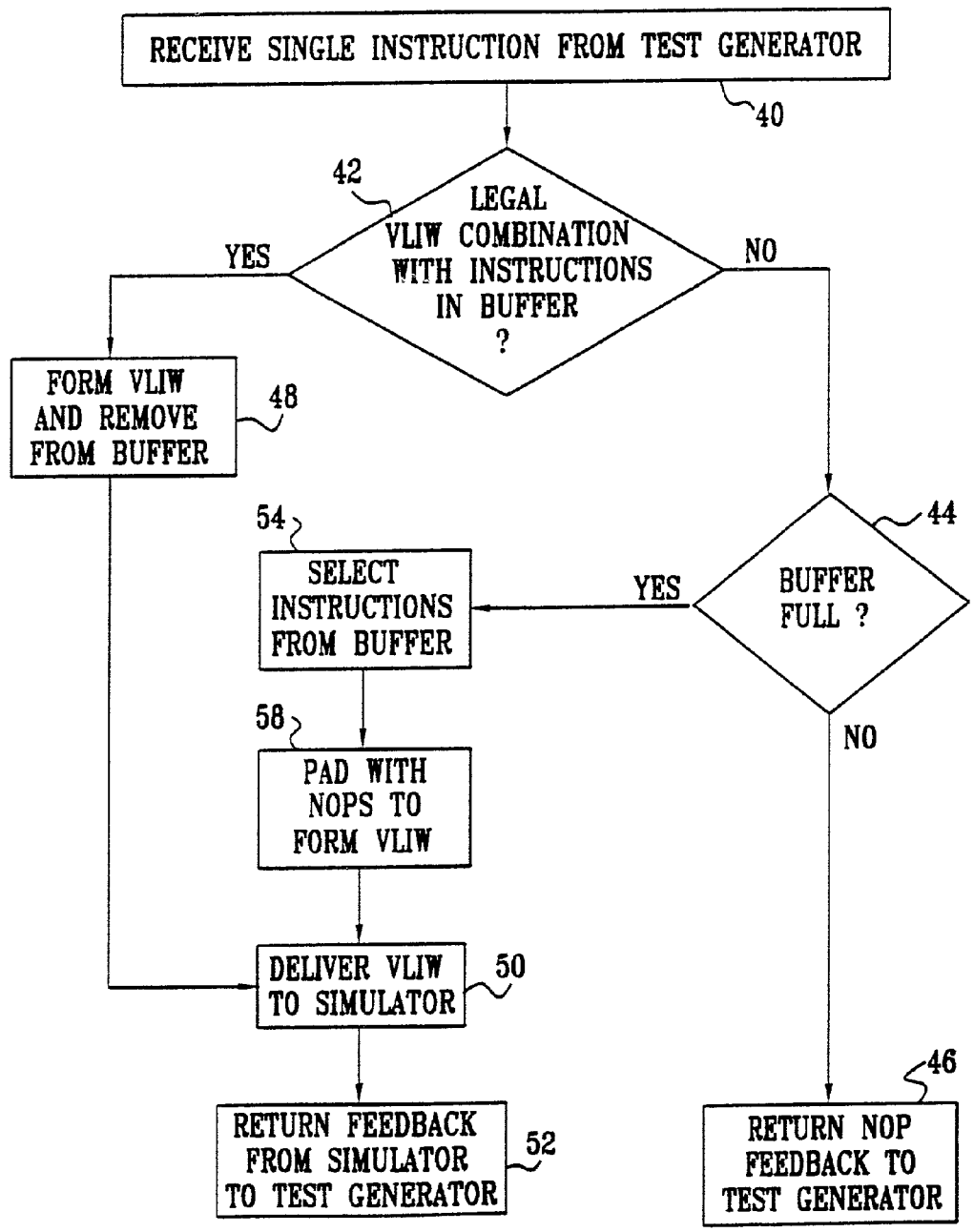
FIG. 3 is a flow chart that schematically illustrates a method for design verification based on dynamic generation of VLIWs, in accordance with a preferred embodiment of the present invention.

FIG. 3 is a flow chart that schematically illustrates a method for design verification using system 30, in accordance with a preferred embodiment of the present invention. This method exemplifies the operation of converter 36 in dynamically generating VLIWs for input to simulator 32 and in processing the execution results of the simulator so as to provide feedback to generator 34.

Each cycle of the method begins with receipt of a single instruction at converter 36 from generator 34, at an instruction receipt step 40. Preferably, generator 34 is programmed to generate test patterns, i.e., sequences of single instructions and resources used by the instructions, that are compatible with the VLIW rules applicable to the target device. These rules are necessarily obeyed by simulator 32. Advanced dynamic test program generators typically enable an operator to control aspects of the test pattern. Given this type of control, the operator can program generator 34 to generate instructions in an order that will allow converter 36 to conveniently assemble legal VLIWs. In addition, the operator can bias the instruction ordering to favor certain types of scenarios and events. Alternatively, generator 34 may be of a type that provides a lower level of operator control, or no control at all over instruction ordering. In this case, converter 36 by itself arranges and maintains the instructions in the proper order, as described below.

Converter 36 preferably maintains a buffer, in which it groups the single instructions to form legal VLIWs. At a combination step 42, the converter checks each new instruction against previous instructions that it received but has not yet passed to simulator 32, in order to determine whether they can be legally combined to make a complete VLIW. For example, referring to word 20 in FIG. 1, converter 36 will insert a memory instruction that it receives from the generator in the first slot of the word, a FPU instruction in the second slot, and arithmetic instructions in the third and fourth slots, so long as all of the instructions obey the VLIW rules of resource use. Typically, a number of different legal VLIW types are permitted. In a simple implementation, the buffer used at step 42 is organized as a queue, and an appropriate number of instructions starting at the head of the queue are checked to determine whether they can make up a legal VLIW. Alternatively, a more complex buffer structure may be maintained, and converter 36 searches the buffer to find possible legal VLIWs.

Until a complete, legal VLIW has been assembled in the buffer, the converter checks at each instruction cycle whether the buffer is full, at a full buffer step 44. As long as the buffer is not full, and the complete VLIW has not been formed, the converter responds to each new instruction that it receives from generator 34 with NOP feedback (also referred to herein as null feedback), at a NOP return step 46. The NOP feedback is equivalent to the response that the simulator would return after executing a NOP (no operation) instruction. It indicates to the generator that there has been no change in the state of the simulated device. This feedback (even though it is dummy feedback) is necessary to the normal operation of the generator. After receiving the feedback, generator 34 generates and passes a new instruction to converter 36 at step 40.

If the converter determines at step 42 that a complete, legal VLIW has been assembled in the buffer, it removes the instructions in the VLIW from the buffer, at a VLIW formation step 48, and delivers the VLIW to simulator 32, at a VLIW delivery step 50. The simulator executes all of the instructions in the VLIW and returns its response to the converter, indicating changes in the state of the simulator as a result of the execution. The converter processes this response to generate real feedback (as opposed to the NOP feedback mentioned above) to generator 34, at a feedback return step 52. In this case, too, the generator responds by generating a new instruction at step 40, using the state information conveyed by converter 36 from simulator 32. This information enables generator 34, for example, to create a resource dependency between successive instructions.

When converter 36 determines at step 44 that the buffer is full, without a legal VLIW having been formed, it removes one or more instructions from the buffer, at an instruction selection step 54. Typically, the buffer has a limited depth, providing a "window" of eight single instructions, for example. Preferably, converter 36 searches the instructions in the buffer and attempts to find a number of legally-compatible instructions from the buffer. Alternatively, the converter may simply pop as many instructions in order from the head of the buffer (or queue) as can be legally combined. It then pads the real instructions with NOP instructions to make a complete, legal word, at a padding step 58. For example, in word 20 (FIG. 1), a NOP might be inserted in the slot reserved for the FPU instruction if no compatible FPU instruction has been received from generator 34. The VLIW is delivered to simulator 32 at step 50. The converter passes feedback from the simulator to the test generator at step 52, as described above, and the next single instruction is then generated and processed.

An example of the operation of the method of FIG. 3 is provided below:

1. We assume that the VLIW architecture in question has four types of single instructions: ALU, FPU, MEMORY and CONTROL, and that there are four types of legal VLIWs:
   a. [ALU, ALU, MEMORY, CONTROL]
   b. [ALU, MEMORY]
   c. [ALU, CONTROL]
   d. [FPU, FPU]

A NOP can appear in place of any instruction.

2. We further assume that converter 36 has a queue (buffer) of four single instructions. After receiving an instruction from test program generator 34, the converter adds the instruction to the tail of the queue (step 40).

3. Converter 36 then checks whether two or four sequential single instructions (since these are the lengths of legal VLIWs in the present example) from the head of the queue can form one of the VLIWs (step 42). The decision whether to form a VLIW is preferably based on heuristic considerations, implemented in the converter. For example when the queue contains two instructions, ALU and MEMORY, the converter may decide to form a VLIW of type "b" or to wait and try to form a VLIW of type "a" with the next two instructions.

4. If a legal VLIW can be formed from two or four instructions from the VLIW queue, then the converter forms the VLIW, removes the instructions from the queue (step 48), delivers the VLIW to the VLIW simulator (step 50), and returns the appropriate feedback to the test generator (step 52).

5. At the end of each cycle, if no VLIW has been formed (i.e., the first two instructions in the queue cannot form any of the VLIW types "b", "c" or "d", and the four instructions cannot be assembled into a VLIW of type "a"), the converter checks whether the queue is full (step 44). If the queue is not full, the converter leaves the queue as is and returns NOP feedback (step 46).

6. If the queue is full, the converter pops instructions from the head of the queue in such a way that with the addition of appropriate NOP instructions, they will create a legal VLIW (steps 54 and 58). A trivial way to carry out these steps is to pop one instruction and add one or more NOP(s) to form one of the VLIW types. More sophisticated implementations are also possible. For example, assume that:
   Queue[0]=ALU0 (head of the queue)
   Queue[1]=ALU1
   Queue[2]=ALU2
   Queue[3]=MEMORY3 (tail of the queue)

Then there are several alternative solutions, for example:
   a. two VLIWs of type "b"—[ALU0, NOP][ALU1, NOP].
   b. one VLIW of type "b"—[ALU0, NOP].
   c. three VLIWs of type "b"—[ALU0, NOP][ALU1, NOP] [ALU2, MEMORY3].

Other solutions are also possible. The decision regarding which of the VLIWs to form and execute is implementation-dependent.

Although preferred embodiments are described hereinabove with reference to dynamic test program generation for a VLIW target device, the principles of the present invention are similarly applicable to simulation testing and verification of other types of parallel processing devices. It will thus be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for functional verification of a design for a parallel processing device, comprising: receiving a sequence of single instructions from a dynamic test program generator; assembling a plurality of the instructions from the sequence into an instruction word, in accordance with predetermined rules applicable to the parallel processing device; and inputting the instruction word to a simulator of the parallel processing device so as to determine a response of the device to the instruction word.

2. A method according to claim 1, wherein receiving the sequence of single instructions comprises providing feedback to the generator after each of the instructions, so that the generator generates a subsequent instruction in the sequence responsive to the feedback.

3. A method according to claim 2, wherein providing the feedback comprises receiving the response to the instruction word from the simulator, and producing the feedback to the generator based on the response.

4. A method according to claim 3, wherein when one of the instructions is received and the instruction word is not input to the simulator before receiving the subsequent instruction in the sequence, providing the feedback comprises providing null feedback to the generator.

5. A method according to claim 4, wherein providing the null feedback comprises providing the feedback as though the device had executed a no-operation (NOP) instruction.

6. A method according to claim 1, wherein assembling the plurality of the instructions comprises holding the instructions in a buffer until sufficient instructions of appropriate instruction types are received to enable the instruction word to be assembled in accordance with the rules.

7. A method according to claim 1, wherein assembling the plurality of the instructions comprises assembling no-operation (NOP) instructions together with the instructions received from the generator when after receiving a predetermined number of the instructions, sufficient instructions of appropriate instruction types have not been received so as to enable the instruction word to be assembled in accordance with the rules.

8. A method according to claim 1, wherein the parallel processing device comprises a Very Long Instruction Word (VLIW) device, and wherein assembling the plurality of the instructions comprises assembling a very long instruction word containing the instructions.

9. A method according to claim 1, wherein assembling the plurality of the instructions comprises assembling the instructions in an order dictated by the rules.

10. A method according to claim 1, wherein assembling the plurality of the instructions comprises assembling the instructions into the word only if the instructions use resources of the device in accordance with the rules.

11. A method according to claim 10, wherein assembling the instructions into the word comprises ensuring that the instructions in the word use source and target addresses in the device in accordance with the rules.

12. Apparatus for functional verification of a design for a parallel processing device, the apparatus comprising a computing platform that comprises one or more computer processors, and which is arranged to generate a sequence of single instructions using a dynamic test program generator program, to assemble a plurality of the instructions from the sequence into an instruction word in accordance with predetermined rules applicable to the parallel processing device, and to simulate operation of the parallel processing device using a simulator program so as to determine a response of the device to the instruction word.

13. Apparatus according to claim 12, wherein the platform is arranged to provide feedback to the generator program after each of the instructions, so that the generator program generates a subsequent instruction in the sequence responsive to the feedback.

14. Apparatus according to claim 13, wherein the platform is arranged to produce the feedback to the generator based on a response to the instruction provided by the simulator program.

15. Apparatus according to claim 14, wherein when one of the instructions is received and the instruction word is not input to the simulator program before receiving the subsequent instruction in the sequence, the platform is arranged to provide null feedback to the generator.

16. Apparatus according to claim 15, wherein the null feedback comprises feedback that is produced as though the device had executed a no-operation (NOP) instruction.

17. Apparatus according to claim 12, wherein the instructions are held in a buffer until sufficient instructions of appropriate instruction types are received to enable the instruction word to be assembled in accordance with the rules.

18. Apparatus according to claim 12, wherein the instruction word comprises no-operation (NOP) instructions together with the instructions received from the generator when after a predetermined number of the instructions are generated, sufficient instructions of appropriate instruction types have not been generated so as to enable the instruction word to be assembled in accordance with the rules.

19. Apparatus according to claim 12, wherein the parallel processing device comprises a Very Long Instruction Word (VLIW) device, and wherein the instruction word comprises a very long instruction word containing the instructions.

20. Apparatus according to claim 12, wherein the plurality of the instructions are assembled in the word in an order dictated by the rules.

21. Apparatus according to claim 12, wherein the plurality of the instructions are assembled into the word only if the instructions use resources of the device in accordance with the rules.

22. Apparatus according to claim 21, wherein the instructions in the word use source and target addresses in the device only in accordance with the rules.

23. A computer software product for functional verification of a design for a parallel processing device, the product comprising a computer-readable medium in which program instructions are stored, which instructions, when read by a computer, cause to computer to receive a sequence of single instructions from a dynamic test program generator, to assemble a plurality of the instructions from the sequence into an instruction word, in accordance with predetermined rules applicable to the parallel processing device, and to input the instruction word to a simulator of the parallel processing device so as to determine a response of the device to the instruction word.

* * * * *